(12) United States Patent
Yasumatsu

(10) Patent No.: US 8,216,876 B2
(45) Date of Patent: Jul. 10, 2012

(54) METHOD FOR MANUFACTURING FLEXIBLE SEMICONDUCTOR SUBSTRATE

(75) Inventor: Takuto Yasumatsu, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 127 days.

(21) Appl. No.: 12/918,412

(22) PCT Filed: Feb. 13, 2009

(86) PCT No.: PCT/JP2009/000572
§ 371 (c)(1),
(2), (4) Date: Aug. 19, 2010

(87) PCT Pub. No.: WO2009/104371
PCT Pub. Date: Aug. 27, 2009

(65) Prior Publication Data
US 2011/0124183 A1 May 26, 2011

(30) Foreign Application Priority Data
Feb. 20, 2008 (JP) ................. 2008-039136

(51) Int. Cl.
*H01L 51/40* (2006.01)
(52) U.S. Cl. .......................................................... 438/99
(58) Field of Classification Search .................... None
See application file for complete search history.

(56) References Cited

U.S. PATENT DOCUMENTS

| | | | |
|---|---|---|---|
| 2007/0254456 A1* | 11/2007 | Maruyama et al. | 438/458 |
| 2007/0295973 A1* | 12/2007 | Jinbo et al. | 257/88 |
| 2008/0003727 A1 | 1/2008 | Jinbo | |
| 2009/0004772 A1* | 1/2009 | Jinbo et al. | 438/99 |

FOREIGN PATENT DOCUMENTS

| | | |
|---|---|---|
| JP | 2006-237542 | 9/2006 |
| JP | 2008-34835 A | 2/2008 |
| JP | 2009-088239 | 4/2009 |

OTHER PUBLICATIONS

English Translation of the International Preliminary Report on Patentability (chapter 1) dated Oct. 14, 2010.
Flexible Displays and Electronics Made in AM-LCD Facilities by the EPLaR™ Process, I. French et al., SID 07, Digest, 58.4, pp. 1680-1683, May 2007.

(Continued)

*Primary Examiner* — Charles Garber
*Assistant Examiner* — Andre' C Stevenson
(74) *Attorney, Agent, or Firm* — Birch, Stewart, Kolasch & Birch, LLP

(57) ABSTRACT

A production method for a flexible semiconductor substrate according to the present invention includes: a step of providing an inorganic substrate 11; a step of forming a polyimide layer 22a on the inorganic substrate by using a material in solution form, the polyimide layer 22a having a thickness of less than 10 μm; a step of forming a semiconductor device on the polyimide layer; a step of, after forming the semiconductor device, removing the polyimide layer from the inorganic substrate; and a step of forming a polyparaxylene resin layer 35, 37 having a thickness which is equal to or greater than the thickness of the polyimide layer. The polyparaxylene resin layer may be formed on the semiconductor device before the removing step, or formed on the opposite side of the polyimide layer from the semiconductor device after the removing step. The production method according to the present invention excels in mass producibility.

5 Claims, 3 Drawing Sheets

OTHER PUBLICATIONS

Laser release process to obtain freestanding multilayer metal-polymide circuits, F.E. Doany et al., IBM Journal of Research and Development, vol. 41, No. 1/2, 1997, pp. 151-157.

Sacrificial Layer Process with Laser-Driven Release for Batch Assembly Operations, A.S. Holmes et al., Journal of Microelectromechanical systems, vol. 7, No. 4, Dec. 1998, pp. 416-422.

Mechanics of rollable and foldable film-on-foil electronics, Z. Suo et al., Applied Physics Letters, vol. 74, No. 8, Feb. 22, 1999, pp. 1177-1179.

Parylene Flexible Neural Electrodes Y. Yoshida et al., Seisan Kenkyu, vol. 55, No. 6, 2003, pp. 44-47, Nov. 2003.

* cited by examiner (a)

(b)

(c)

(d)

METHOD FOR MANUFACTURING FLEXIBLE SEMICONDUCTOR SUBSTRATE

TECHNICAL FIELD

The present invention relates to a production method for a flexible semiconductor substrate having a semiconductor device on a flexible substrate.

BACKGROUND ART

In recent years, as one way of adding value to display devices, development of display devices having flexibility (flexible displays) is in progress. Being developed as flexible displays are liquid crystal display devices, organic EL display devices, and electrophoresis display devices.

For example, Non-Patent Documents 1-3 discloses a process in which, after producing TFTs on a polyimide layer that is formed on a glass substrate, the polyimide layer is irradiated with laser light through the glass substrate, and the polyimide layer is removed from the glass substrate. According to this method, a solution of a precursor of polyimide (i.e., also referred to as polyamic acid) is applied on the glass substrate, and a polyimide layer which is obtained by imidizing this is utilized as a flexible substrate.

Moreover, Non-Patent Document 4 proposes concepts such as a high region device on polyimide (e.g., a large-sized sensor), a wallpaper display, and the like, where TFTs are fabricated on a polyimide film.

[Non-Patent Document 1] SID 07, DIGEST, 58.4, I. French et al., 1680, "Flexible Displays and Electronics Made in AM-LCD Facilities by the EPLaRTM Process"

[Non-Patent Document 2] IBM Journal of Research and Development Volume 41, numbers 1/2 1997 Optical lithography, Doany F. E., et al. "Laser release process to obtain freestanding multilayer metal-polyimide circuits"

[Non-Patent Patent Document 3] Journal of Microelectromechanical systems, Volume 7, issue 4, December 1998, pp. 416-422, Holmes, A. S., et al. "Sacrificial layer process with laser-driven release for batch assembly operations"

[Non-Patent Document 4] Applied Physics Letters, vol. 74, No. 8, Feb. 22, 1999, pp. 1177-1179, Z. Suo, et al., "Mechanics of Rollable and Foldable Film-on-Foil Electronics"

DISCLOSURE OF INVENTION

Problems to be Solved by the Invention

The methods described in Non-Patent Documents 1-3 above have a problem in that, if the polyimide layer is thin, due to a stress which occurs between itself and the semiconductor layer or the like after being removed from the glass substrate, the flexible substrate may warp, such that the substrate may become rounded in worst cases. Therefore, conventionally, warp has been suppressed by forming a sufficiently thick polyimide layer. According to a study by the inventor, in order to suppress warp of the flexible substrate, it is necessary to form a polyimide layer with a thickness of at least 10 µm.

However, according to a study by the inventor, when a polyimide layer having a thickness of 10 µm or more is formed, there is a large amount of moisture remaining in the polyimide layer, so that moisture may occur as a concomitant gas in a subsequent process for forming TFTs, e.g., a film formation process based on CVD technique, and thus the degree of vacuum may be deteriorated, and the quality of the inorganic film that is deposited may be deteriorated.

The present invention has been made in view of the aforementioned problems, and a main objective thereof is to provide a production method for a flexible semiconductor substrate which excels in mass producibility.

Means for Solving the Problems

A production method for a flexible semiconductor substrate according to the present invention is a production method for a flexible semiconductor substrate having a flexible substrate and a semiconductor device formed on the flexible substrate, comprising: (a) a step of providing an inorganic substrate; (b) a step of forming a polyimide layer on the inorganic substrate by using a material in solution form, the polyimide layer having a thickness of less than 10 µm; (c) a step of, after step (b), forming the semiconductor device on the polyimide layer; and (d) a step of, after step (c), removing the polyimide layer from the inorganic substrate, further comprising: (e1) a step of, after step (c) and before step (d), forming a polyparaxylene resin layer on the semiconductor device, the polyparaxylene resin layer having a thickness which is equal to or greater than a thickness of the polyimide layer; or (e2) a step of, after step (d), forming a polyparaxylene resin layer on an opposite side of the polyimide layer from the semiconductor device, the polyparaxylene resin layer having a thickness which is equal to or greater than a thickness of the polyimide layer. It will be appreciated that both of step (e1) and step (e2) may be executed. Preferably, the thickness of the polyimide layer is 5 µm or more.

In one embodiment, step (b) comprises (b1) a step of applying a solution containing polyamic acid on the inorganic substrate, and a (b2) a step of imidizing the polyamic acid applied on the inorganic substrate.

In one embodiment, the inorganic substrate is an inorganic substrate which transmits light of a predetermined wavelength, and after step (c), a step of irradiating the polyimide layer with light of the predetermined wavelength through the inorganic substrate is further comprised.

In one embodiment, step (c) further comprises a step of forming an inorganic underlying layer on a surface for forming the semiconductor device, the semiconductor device being formed on the inorganic underlying layer.

In one embodiment, after step (e1) and step (d) or before step (e2), a step of forming a further polyparaxylene resin layer is further comprised.

By using a flexible semiconductor substrate according to the present invention, a flexible display such as a liquid crystal display device, an organic EL display device, or an electrophoresis display device, a driving circuit device for use in any such display device, and a memory device or a sensor device can be produced. Any flexible electronic device having the flexible semiconductor substrate may be produced by executing a step of forming semiconductor devices on a polyimide layer on a glass substrate by the above production method, and then executing steps which are necessary for producing each electronic device, and thereafter executing a step of removing the polyimide layer from the glass substrate.

Effects of the Invention

In a production method for a flexible semiconductor substrate according to the present invention, a polyimide layer having a thickness of less than 10 µm is formed by using a material in solution form, and thereafter a semiconductor device is formed, and then a polyparaxylene resin layer having a thickness which is equal to or greater than the thickness of the polyimide layer is formed on the upper portion of the semiconductor layer or on the lower portion of the polyimide layer. Therefore, not much moisture is left in the polyimide layer, and the semiconductor device can be stably formed. Moreover, by forming a polyparaxylene resin layer having a thickness which is equal to or greater than the thickness of the polyimide layer, warp of the flexible substrate is suppressed, and a sufficient mechanical strength is ensured. Therefore, according to the present invention, a production method for a flexible semiconductor substrate which excels in mass producibility is provided.

Figure 1:
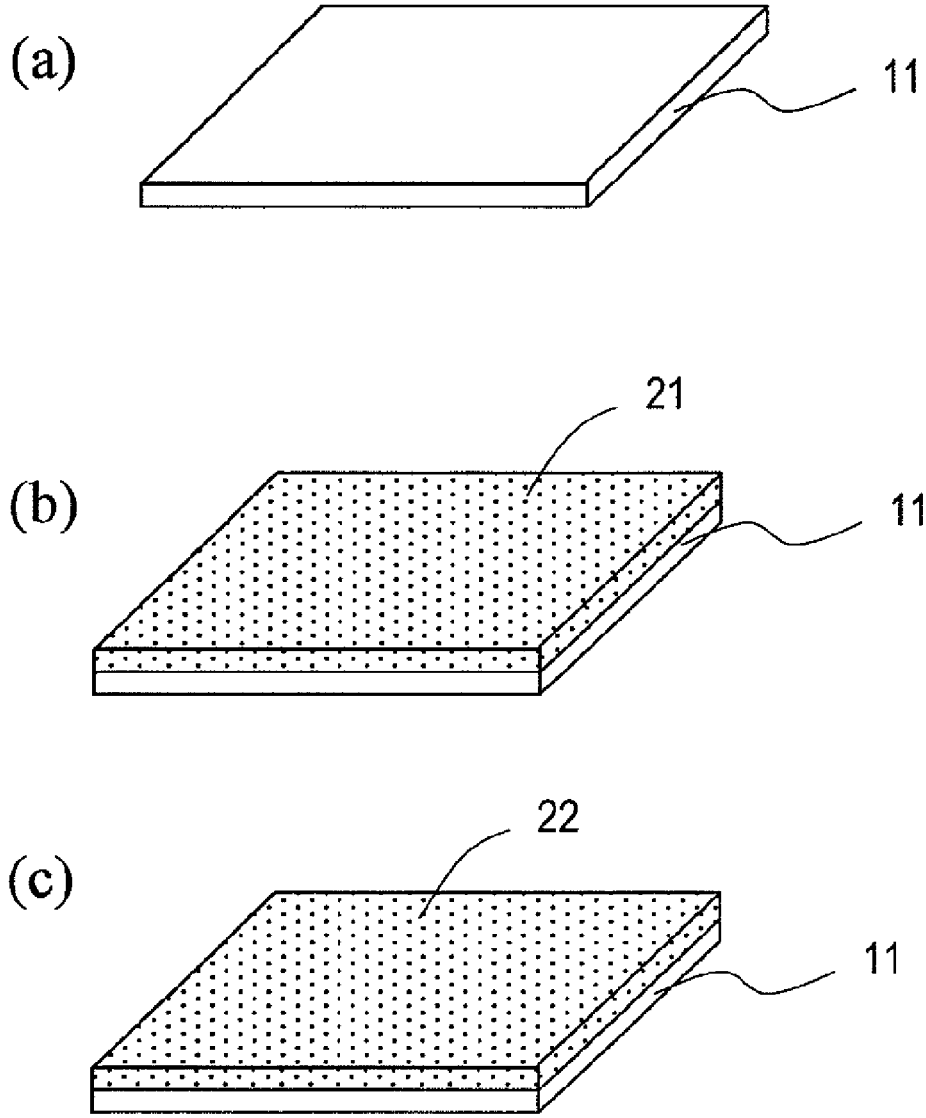
FIG. 1 (a) to (c) are schematic diagrams for describing a production method for a flexible semiconductor substrate according to an embodiment of the present invention (continues to FIG. 2).

DESCRIPTION OF REFERENCE NUMERALS 11 inorganic substrate
32 material in solution form (polyamic acid solution)
22 polyimide layer
35, 37 polyparaxylene resin layer
56 planarization film
57a, 57b contact hole
61 inorganic underlying layer
63a $SiO_2$ layer
63b $SiN_x$ layer
64 semiconductor layer (p-Si layer)
65 insulating layer
65a $SiO_2$ layer
65b $SiN_x$ layer
66 second inorganic insulating film ($SiN_x$ film)
68 gate electrode
72a source electrode
72b drain electrode
82 passivation film
100 flexible substrate
100A, 100B flexible semiconductor substrate (active matrix substrate)

BEST MODE FOR CARRYING OUT THE INVENTION

Hereinafter, with reference to the drawings, a production method for a flexible semiconductor substrate according to an embodiment of the present invention will be described. Herein, an active matrix substrate which is used for a flexible display is described as an example. Note that the present invention is not limited to the exemplary embodiment illustrated herein.

A production method for a flexible semiconductor substrate according to an embodiment of the present invention includes: a step of providing an inorganic substrate (e.g., a glass substrate); a step of forming a polyimide layer having a thickness of less than 10 μm by using a material in solution form on the inorganic substrate; a step of forming a semiconductor device on the polyimide layer; a step of removing the polyimide layer from the inorganic substrate after forming the semiconductor device; and a step of forming a polyparaxylene resin layer having a thickness which is equal to or greater than the thickness of the polyimide layer. The polyparaxylene resin layer may be formed on the semiconductor device before the removing step, or formed on the opposite side of the polyimide layer from the semiconductor device after the removing step.

Figure 2:
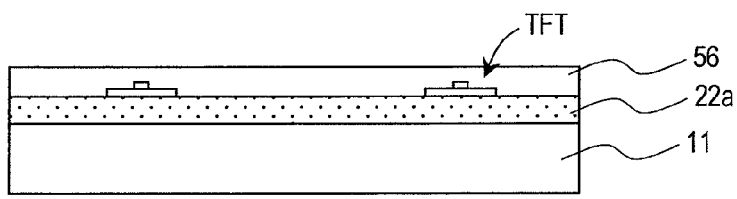
FIG. 2 (a) to (d) are schematic diagrams for describing a production method for a flexible semiconductor substrate according to an embodiment of the present invention (continues from FIG. 1).
Figure 2:
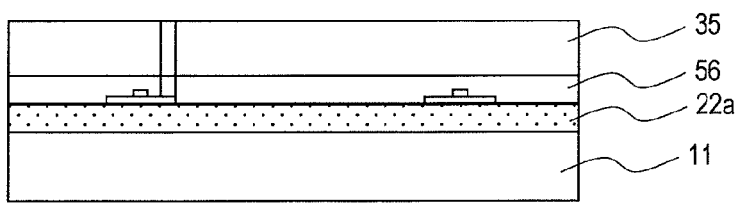
Figure 2:
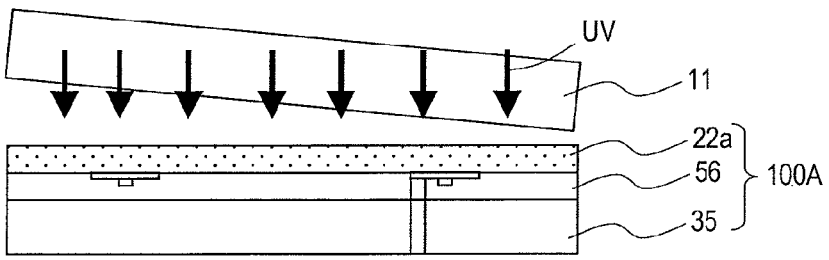
Figure 2:
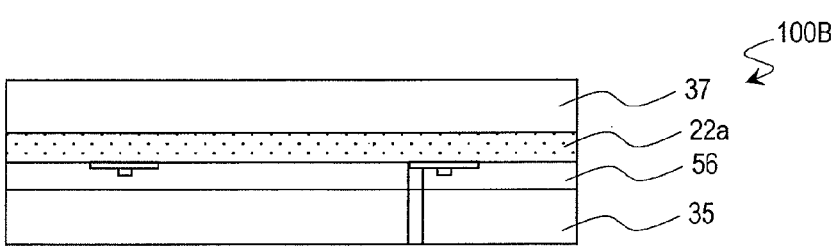

With reference to FIG. 1 and FIG. 2, the production method for a flexible semiconductor substrate according to an embodiment of the present invention will be described.

First, as shown in FIG. 1(a), an inorganic substrate 11 is provided. As the inorganic substrate 11, from the standpoint of handling ease or the like, that which has moderate rigidity and mechanical strength is preferable, and non-alkali glass substrates which are used for liquid crystal display devices and the like can be suitably used. A non-alkali glass substrate also has an advantage of translucency (including ultraviolet). Hereinafter, a non-alkali glass substrate 11 is used as the inorganic substrate 11.

Next, as shown in FIG. 1(b), a material in solution form 21 for forming the polyimide layer is applied on the glass substrate 11. The material in solution form is typically a solution containing polyamic acid, which is a precursor of polyimide. As used herein, polyamic acid includes polyamic acid a portion of which has been imidized. Moreover, in the case where soluble polyimide is used, a solution which contains polyimide as the material in solution form can be used.

The step of applying the material in solution form 21 on the glass substrate 11 can be performed by using a coating technique such as spin coating technique or slit coating technique, or a printing technique such as screen printing, for example. Thereafter, drying is performed at 120° C. for 3 min, and baking is performed at 350 to 500° C. for 1 h, thus obtaining the polyimide layer. At this time, the thickness of the film composed of the material in solution form 21 is adjusted so that the finally-obtained polyimide layer 22 has a thickness of less than 10 μm. The thickness of the material in solution form 21 can be controlled by adjusting the viscosity of the material in solution form 21 and the conditions of applying the material in solution form 21. In the case of a material whose viscosity is difficult to be adjusted, a wet or dry etching technique may be employed to reduce the once-formed polyimide layer having a thickness of 10 μm or more into a thin film, thus attaining a thickness of 10 μm or less.

Since the polyimide layer 22 is utilized as a sacrificial layer for allowing the polyimide layer 22 and TFTs and the like formed thereon to be removed from the glass substrate, there are no requirements as to mechanical strength and the like for the polyimide layer 22. Therefore, the polyimide layer 22 may have a thickness of 1 μm or less. It is preferable that the coefficient of thermal expansion of the polyimide layer is equal or close to the coefficient of thermal expansion of the inorganic substrate (which herein is a non-alkali glass). The coefficient of thermal expansion of a generic non-alkali glass is 4 to 6 ppm/° C., and it is preferable to use a polyimide material having a similar coefficient of thermal expansion.

Thus, as shown in FIG. 1(c), the polyimide layer 22 is formed on the glass substrate 11 in this order. Thereafter, the polyimide layer 22 is removed from the glass substrate 11, whereby the polyimide layer 22 is utilized as a flexible substrate. By regarding the glass substrate 11 and the polyimide layer 22 formed thereon integrally as a usual substrate, TFTs are fabricated on the polyimide layer 22. The step of forming the TFTs comprises formation of a semiconductor layer, formation of an insulating layer, and formation of a wiring layer (including electrodes and wiring lines). The layer including the semiconductor layer, the insulating layer, and the wiring layer may be referred to as a "TFT-containing layer" for simplicity. Note that, from standpoints such as reliability against humidity, it is preferable to form an inorganic underlying layer (e.g., an $SiN_x$ or $SiO_2$ film) before fabricating the TFTs, and form the semiconductor devices upon the inorganic underlying layer. The process of fabricating the TFTs will be described later. The individual steps of the process of fabricating the TFTs may be known steps.

Next, FIGS. 2(a) to (d) are referred to.

First, as shown in FIG. 2(a), the TFTs are fabricated on the polyimide layer 22a (thickness: 10 μm or less) formed on the glass substrate 11. Preferably, the polyimide layer 22a has a thickness of 5 μm or more. Note that an inorganic underlying layer may be formed before fabricating the TFTs, and the TFTs may be formed upon the inorganic underlying layer. Next, a planarization film 56 is formed so as to cover the TFTs. As the planarization film 56, a resin layer having a thickness of 3 μm may be used, for example. The planarization film 56 is omissible. Since the planarization film 56 is formed after the semiconductor devices are fabricated, the planarization film 56 does not need to have a high thermal resistance, and it can be formed by using various resins without being limited to heat-resistant resins such as polyimide. Moreover, since TFTs may be formed on the planarization film 56, it may also be referred to as an interlayer insulating film 56.

Next, as shown in FIG. 2(b), a polyparaxylene resin layer 35 having a thickness which is equal to or greater than the thickness of the polyimide layer 22a is formed. By ensuring that the thickness of the polyparaxylene resin layer 35 is equal to or greater than the thickness of the polyimide layer 22a, warp of the flexible substrate (a semiconductor substrate 100A in FIG. 2(c)) can be suppressed.

A polyparaxylene resin is a transparent resin which is used as the protection films of medical instruments such as catheters or as the insulative protection films of ferrite cores, and is a resin which is obtained by pyrolyzing a paraxylene dimer and allowing its monomer to deposit at room temperature by using a low pressure CVD method. This resin can form a film at room temperature, and can be used in the case where the withstand temperature of the TFTs or the elements driven thereby is low.

Generally speaking, the dimer which is directly generated from paraxylene is referred to as parylene N. Parylene C (2-substituted) and parylene D (4-substituted) in which hydrogen of an aromatic ring is substituted with chlorine are known. Polyparaxylene resins and production methods thereof are described in Yoshida et al., SEISAN KENKYU, vol. 55, No. 6, pp. 502 to 505, 2003, for example. The entire disclosure of this document is incorporated herein by reference.

Herein, by using parylene C, for example, the polyparaxylene resin layer 35 is formed under conditions of 23° C. and 1 Pa.

Next, as shown in FIG. 2(c), via irradiation with ultraviolet (preferably excimer laser light, e.g., wavelength of 308 nm) through the glass substrate 11, the adhesion at the interface between the glass substrate 11 and the polyimide layer 22a is reduced, and the polyimide layer 22a is removed from the glass substrate 11. Via irradiation with laser light of a short wavelength, the bond between the polyimide layer 22a and the glass substrate 11 is severed due to the optical and thermal actions, and an organic component is partially removed (ablation) or sublimated. Since excimer laser light is pulsed light whose pulse width is 1 μsec or less, it does not damage the TFTs and the like formed on the polyimide layer 22a. It is preferable to irradiate the entire surface of the glass substrate 11 with laser light by scanning the glass substrate 11 with laser light in a relative manner. Thus, in order to remove the polyimide layer 22a from the glass substrate 11 by using laser light, it is necessary that the glass substrate 11 transmits at least a portion of the laser light, and the transmittance with respect to the laser light is preferably as high as possible. Note that the polyimide layer 22a may partially remain on the glass substrate 11.

Although a step of removing the polyimide layer 22a from the glass substrate 11 by using laser light is described herein, this is not a limitation; an etchant for polyimide (also called a remover) may also be used.

The structure obtained in this manner, in which the TFT-containing layer is interposed between the polyimide layer 22a and the polyparaxylene resin layer 35, can be utilized as the flexible semiconductor substrate 100A.

Furthermore, as necessary, as shown in FIG. 2(d), a polyparaxylene resin layer 37 may further be formed on the rear face of the polyimide layer 22a. The polyparaxylene resin layer 37 can be formed by a method similar to that for the polyparaxylene resin layer 35, and the thickness of the polyparaxylene resin layer 37 is preferably equal to or greater than the thickness of the polyimide layer 22a.

By thus forming the polyparaxylene resin layer 37 on the rear face, there is obtained a flexible semiconductor substrate 100B having a structure such that the TFT-containing layer and the polyimide layer 22a are sandwiched between the polyparaxylene resin layers 35 and 37. With the structure in which a polyparaxylene resin layer is formed on only one face, the substrate may be warped at a high temperature of 50° C. or more. This is because, while the inorganic film composing the TFT-containing layer and the polyimide layer 22a have low coefficients of thermal expansion of about 5 ppm/° C. or less, the polyparaxylene resin has a coefficient of thermal expansion which is as high as 30 ppm/° C. By adopting the structure in which the polyparaxylene resin layers 35 and 37 are formed on both sides of the polyimide layer 22a, as in the flexible semiconductor substrate 100B shown in FIG. 2(d), it becomes possible to suppress warp of the substrate even when used at a high temperature of 50° C. or more.

From the standpoint of mechanical characteristics, the thicknesses of the polyparaxylene resin layers 35 and 37 of the above-described flexible semiconductor substrates 100A and 100B are each set equal to or greater than the thickness of the polyimide layer 22a, and is typically set in a range of no less than 10 μm and no more than 30 μm.

Note that the polyparaxylene resin layer 35 may be omitted, thus resulting in a construction where only the polyparaxylene resin layer 37 is provided. In this case, the polyparaxylene resin layer 37, the polyimide layer 22a (and the planarization layer 56) compose the flexible substrate.

Figure 3:
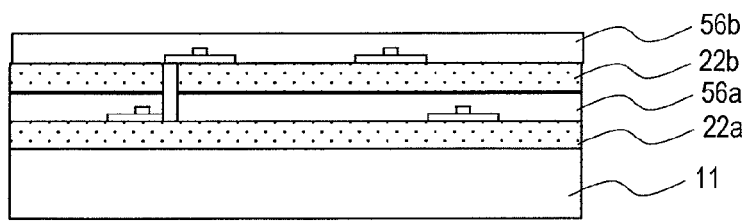
FIG. 3 A schematic diagram showing a cross-sectional structure of a flexible semiconductor substrate according to still another embodiment of the present invention.

An example of providing only one TFT-containing layer is illustrated herein. However, of course this is not a limitation, and a plurality of layers containing TFTs may be provided. For example, as shown in FIG. 3, TFTs may be formed on the polyimide layer 22a, and furthermore a polyimide layer 22b may be formed, with TFTs being formed on the polyimide layer 22b. The planarization films 56a and 56b are omissible. Although omitted from FIG. 3, the final flexible semiconductor substrate includes a polyparaxylene resin layer above the TFTs, or on the opposite side of the polyimide layer 22a from the TFTs.

Next, with reference to FIG. 4 and FIG. 5, a TFT structure which is suitable for the flexible semiconductor substrate according to an embodiment of the present invention and a production method thereof will be described. A semiconductor substrate having TFTs (active matrix substrate) includes layers composed of highly rigid and brittle materials, such as semiconductor layers, inorganic insulating films (e.g., a gate insulating film), wiring layers (including gate electrodes, source electrodes, drain electrodes, and gate bus lines and source bus lines). Therefore, when these are formed on the entire surface of a flexible substrate, its flexibility may be undermined, or partial destruction may occur, thus resulting in deteriorated characteristics and reliability.

A semiconductor layer to become an active layer of the TFTs are formed in island shapes, and the wiring lines are formed so as to extend in a predetermined direction. On the other hand, the insulating films such as a gate insulating film, are generally formed across the entire surface. The wiring lines can have a sufficient flexibility when they are made of a metal material.

On the other hand, in order to ensure reliability of the TFTs, an enclosed structure is preferable, as is described in Japanese Patent Application No. 2007-255940 by the inventor. The entire disclosure of Japanese Patent Application No. 2007-255940 is incorporated herein by reference.

Therefore, in order to ensure flexibility along at least one direction upon the flexible substrate, any insulating film that may detract from flexibility is formed so as to not to be continuous along the at least one direction (so that a portion of the surface of the flexible substrate is exposed). For example, by forming a gate insulating film so as to enclose gate bus lines, and providing regions where no gate insulating film is present between adjoining gate bus lines, flexibility along a direction which is orthogonal to the gate bus lines can be ensured. In other words, flexing is possible so that valleys or hills extending along a direction which is parallel to the gate bus line can be created.

Figure 4:
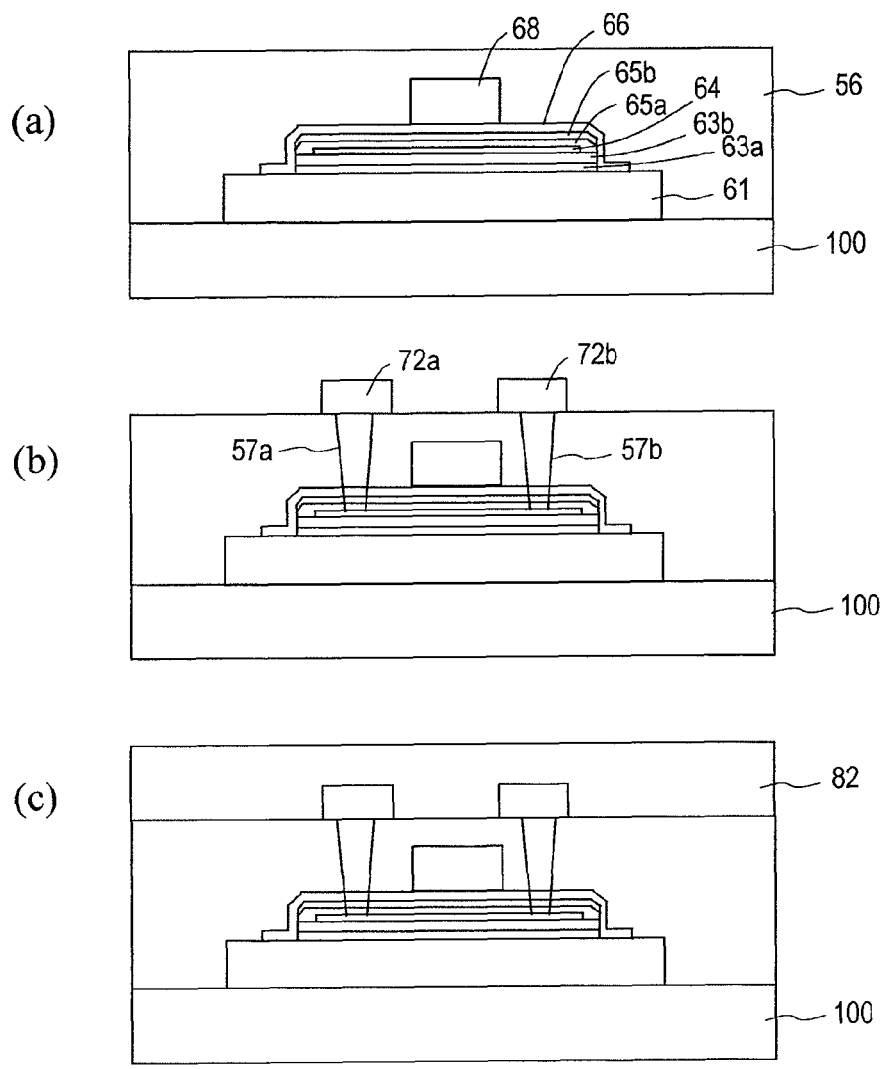
FIG. 4 (a) to (c) are schematic diagrams for describing an example of a TFT structure which is suitable for a flexible semiconductor substrate according to an embodiment of the present invention and a production method thereof.

For example, TFTs having an enclosed structure shown in FIG. 4 can be suitably used.

First, with reference to FIGS. 4(a) to (c), a TFT structure having an enclosed structure and a production method thereof will be described. Although it will be described as a step of forming TFTs on the flexible substrate 100 for simplicity of description, the step of forming the TFTs is to be performed on the glass substrate 11, as described earlier.

As shown in FIG. 4(a), an inorganic underlying layer 61 is formed on the flexible substrate 100. The inorganic underlying layer 61 is an SiO$_2$ film (thickness 1 µm), for example. Herein, the inorganic underlying layer 61 is selectively provided under a TFT and a gate bus line, and has end portions which are parallel to the gate bus line. That is, the inorganic underlying layer 61 is formed so as not to detract from the flexibility along a direction which is orthogonal to the gate bus line. Note that the inorganic underlying layer 61 is omissible.

An enclosed structure is formed on the inorganic underlying layer 61. The enclosed structure includes: an island-shaped first inorganic insulating film 63a and 63b; a multilayer body formed on the first inorganic insulating film, the multilayer body including a semiconductor layer 64 and insulating layers 65a and 65b adjoining it; and a second inorganic insulating film 66 covering the multilayer body. It will be appreciated that the first inorganic insulating film 63a and 63b and the insulating layers 65a and 65b may each be a single layer. Thus, the semiconductor layer 64 and the interface between the semiconductor layer 64 and the insulating layer 65a are enclosed by the first and second insulating films. Therefore, the semiconductor layer 64 and the interface between the semiconductor layer 64 and the insulating layer 65a, by which the characteristics and reliability of the TFTs are affected the most, are isolated from the flexible substrate 100 and other members, and protected from intrusion of impurities such as moisture.

As the first inorganic insulating film, herein, a two-layered film of an SiN$_x$ layer 63b (thickness 40 nm)/SiO$_2$ layer 63a (thickness 50 nm) is used. Instead of a two-layered film, a single-layered film may be used, or a multilayer film of three or more layers (e.g., SiO$_2$ layer/SiN$_x$ layer/SiO$_2$ layer) may be used. The SiO$_2$ layer 63a, the SiN$_x$ layer 63b, and the a-Si layer (which will finally become the p-Si layer 64) can be formed by using a known thin film deposition technique such as CVD, at a temperature of 300° C. to 350° C.

Next, the a-Si layer is irradiated with laser light, thus conducting a dehydrogenation treatment and crystallizing the amorphous silicon, whereby the polycrystalline silicon (p-Si) layer 64 is obtained. Usually, a single instance of laser irradiation cannot provide a p-Si layer having a sufficient crystallinity. Therefore, by performing two laser irradiation steps, a p-Si layer 64 that is composed of crystal grains whose average crystal grain size is 100 nm or more, for example, is obtained. Thus, the TFTs which are fabricated by using the p-Si layer 64 with a high crystallinity can be utilized as TFTs of a driving circuit of a display device. It will be appreciated that crystallinity may be controlled as necessary. The p-Si layer 64 is patterned so as to correspond to the regions (active regions) in which the TFTs are to be fabricated. The patterning can be performed by a known method which employs a photolithography technique and an etching technique.

Next, the patterned p-Si layer 64 is exposed to hydrogen gas. Before exposure to the hydrogen gas, in order to remove the impurities and the like having adhered to the surface of the p-Si layer 64, and the like, it is preferable to perform cleaning processes such as UV irradiation, ozone cleaning, HF cleaning, water cleaning, and alkaline cleaning.

Next, the insulating layers 65a and 65b are formed so as to cover the p-Si layer 64 having been exposed to the hydrogen gas. In the construction exemplified herein, an SiO$_2$ layer 65a (thickness: 50 nm) and an SiN$_x$ layer 65b (thickness: 20 nm) are formed. These function as a gate insulating film. A gate insulating film is to be provided between a gate electrode and a channel region of the semiconductor layer, such that its face on the semiconductor-layer side is in contact with the semiconductor layer. Herein, the SiO$_2$ layer 65a is formed so as to be in contact with the p-Si layer 64. The SiO$_2$ layer 65a and the SiN$_x$ layer 65b can be deposited at a temperature range of 200° C. to 300° C. by a known thin film deposition technique. Although the gate insulating film may be a single layer (e.g., the SiO$_2$ layer 65a), stacking the SiN$_x$ layer 65b provides an advantage of improving the endurance against intrusion of moisture, Na, or the like, and stabilizing the threshold voltage of the TFTs.

Next, the multilayer structure (the SiO$_2$ layer 63a and the SiN$_x$ layer 63b, the p-Si layer 64, the SiO$_2$ layer 65a, and the SiN$_x$ layer 65b in this order from below) is patterned into a predetermined shape. This patterning can be performed by wet or dry etching, for example. As a result, this multilayer structure attains an island shape having its edge on the island-shaped inorganic underlying layer 61.

Next, the SiN$_x$ film 66 (thickness 20 nm) to become a second inorganic insulating film is deposited so as to cover the island-shaped multilayer structure. The SiN$_x$ film 66 serves as the third layer in the gate insulating film. The p-Si layer 64, the SiO$_2$ layer 65a, and the SiN$_x$ layer 65b are three-dimensionally enclosed by the first inorganic insulating film (SiN$_x$ layer 63b/SiO$_2$ layer 63a) and the second inorganic insulating film (SiN$_x$ film 66). That is, when viewed from the normal direction of the p-Si layer 64, the outer periphery of the p-Si layer 64 and the interface between the p-Si layer 64 and the SiO$_2$ layer 65a is surrounded by the first inorganic insulating film (SiN$_x$ layer 63b/SiO$_2$ layer 63a) and the second inorganic insulating film (SiN$_x$ film) 66. Thus, the enclosed structure is obtained. Next, the SiN$_x$ film 66 is etched into a predetermined pattern. Herein, the edge of the SiN$_x$ film 66 forms on the surface of the inorganic underlying layer 61.

Thereafter, a gate electrode 68 is formed on the SiN$_x$ film 66. The gate electrode 68 may be a multilayer structure of a Ti layer (thickness 50 nm) and an Al layer (or an Al alloy layer) (thickness 250 nm), for example, and any known construction such as a single layer or a multilayer structure of three layers or more can be adopted. Examples of materials for forming the gate electrode 68 include W/TaN, W, Mo, Ta, and the like.

After forming the gate electrode 68, by implanting an impurity through the gate electrode 68 as a mask, a source region and a drain region (neither is shown) are formed in the p-Si layer 64 in a self-aligning manner.

Thereafter, an activation treatment for the impurity is performed. The activation treatment may be performed by (a) a method using a short-wavelength laser or (b) a method using long-wavelength laser or lamp. Regardless of which method is adopted, it is preferable to further perform an activation anneal treatment at 300° C. to 410° C. for about 1 hour by using an electric furnace. This activation anneal treatment can also double as a hydrogenation treatment for p-Si (a treatment for terminating the dangling bond). As the hydrogen for the hydrogenation, the hydrogen contained in the SiN$_x$ layer 63b or 65b can be used.

Preferably, the construction of the gate electrode 68 is to be selected based on which one of methods (a) and (b) above is adopted.

In the case where the p-Si of the source region/drain region is to be heated with a higher priority, the aforementioned method (a) is adopted. For example, a second harmonic of an excimer laser or solid laser is used. In this case, it is preferable to use a high-reflectance material such as Al or an Al alloy as the uppermost layer of the gate electrode 68.

On the other hand, in the case where the p-Si of the channel region under the gate electrode 68 is to be heated with a higher priority, the aforementioned method (b) is adopted. For example, the gate electrode 68 is heated by using light having a wavelength longer than 1 µm, e.g., a first harmonic of a solid laser or light from a halogen lamp. In this case, it is preferable to use a material having a high absorptance of light as the uppermost layer of the gate electrode 68 (e.g., at least one kind of metal selected from the group consisting of Mo, Ti, Ta, and W, or an alloy including any such metal).

Next, an organic interlayer insulating film 56 (thickness 1 µm) covering these is formed. The organic interlayer insulating film 56 can be formed by using a fluoroplastic or polyimide, for example. By forming the organic interlayer insulating film 56 with an organic resin, flexibility (softness) can be maintained even if the organic interlayer insulating film 56 is formed so as to cover the entire surface of the flexible substrate 100.

Thereafter, as shown in FIG. 4(b), contact holes 57a and 57b reaching the p-Si layer 64 are formed through the SiO$_2$ layer 65a, the SiN$_x$ layer 65b, the SiN$_x$ film 66, the organic interlayer insulating film 56; and contact portions as well as a source electrode 72a and a drain electrode 72b are formed; thus, a TFT is obtained.

Furthermore, as shown in FIG. 4(c), a passivation film 82 is formed by using an organic resin. By forming the passivation film 82 with an organic resin, flexibility (softness) can be maintained even if the passivation film 82 is formed so as to cover the entire surface of the flexible substrate 100.

Figure 5:
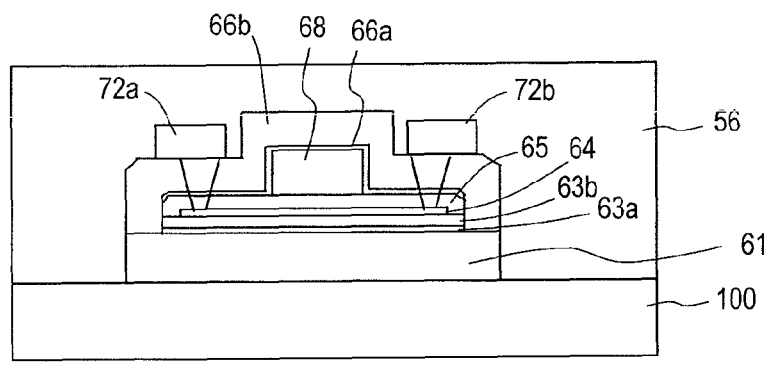
FIG. 5 A schematic diagram for describing another example of a TFT structure which is suitable for a flexible semiconductor substrate according to an embodiment of the present invention.

Furthermore, a construction shown in FIG. 5 can be adopted.

In the construction shown in FIG. 5, too, the inorganic underlying layer 61 is selectively provided under a TFT and a gate bus line, and has end portions which are parallel to the gate bus line. That is, the inorganic underlying layer 61 is formed so as not to detract from the flexibility along a direction which is orthogonal to the gate bus line.

In the TFT shown in FIG. 5, a gate insulating film is formed from a single layer of the SiO$_2$ layer 65, and, a first interlayer insulating film 66a and a second interlayer insulating film 66b covering the gate electrode 68 are provided. Moreover, the source electrode 72a and the drain electrode 72b are in contact with a source region and a drain region of the p-Si layer 64, respectively, within contact holes which penetrate the first interlayer insulating film 66a, the second interlayer insulating film 66b, and the gate insulating film 65 to reach the p-Si layer 64. The first interlayer insulating film 66a and the second interlayer insulating film 66b are patterned similarly to the inorganic underlying layer 61, and has end portions which are parallel to the gate bus line.

The structure of the TFT-containing layer is not limited to the aforementioned examples, but admits of various modifications. Moreover, the other constituent elements for constructing a liquid crystal display device, an organic EL display device, or an electrophoresis display device, driving devices therefor, or a sensor device or a memory device can be produced by various known methods.

On the surface of a flexible semiconductor substrate obtained in the above manner, an electrically conductive layer may be further provided. At least the electrically conductive layer which is provided on the viewer side needs to be a transparent electrically conductive layer (e.g., ITO), but the electrically conductive layer on the rear face side may be a metal layer. By providing an electrically conductive layer, an improved endurance against electrostatic can be provided.

By using a flexible semiconductor substrate according to an embodiment of the present invention, a flexible display such as a liquid crystal display device, an organic EL display device, or an electrophoresis display device, a driving circuit device for use in any such display device, and a memory device or a sensor device can be produced. Any flexible electronic device having the flexible semiconductor substrate can be produced by executing a step of forming semiconductor devices on a polyimide layer on a glass substrate by the above-described production method, and then executing steps which are necessary for producing each electronic device, and thereafter executing a step of removing the polyimide layer from the glass substrate. Therefore, these flexible electronic devices can be made into a size as large as the glass substrates, and thus giant flexible devices, roll displays, and the like can be produced.

INDUSTRIAL APPLICABILITY

The present invention is suitably used for the production of a flexible semiconductor substrate for use in a flexible display or the like.

The invention claimed is:

1. A production method for a flexible semiconductor substrate having a flexible substrate and a semiconductor device formed on the flexible substrate, comprising:
   (a) a step of providing an inorganic substrate;
   (b) a step of forming a polyimide layer on the inorganic substrate by using a material in solution form, the polyimide layer having a thickness of less than 10 µm;
   (c) a step of, after step (b), forming the semiconductor device on the polyimide layer; and
   (d) a step of, after step (c), removing the polyimide layer from the inorganic substrate, further comprising:
   (e1) a step of, after step (c) and before step (d), forming a polyparaxylene resin layer on the semiconductor device, the polyparaxylene resin layer having a thickness which is equal to or greater than a thickness of the polyimide layer; or
   (e2) a step of, after step (d), forming a polyparaxylene resin layer on an opposite side of the polyimide layer from the semiconductor device, the polyparaxylene resin layer having a thickness which is equal to or greater than a thickness of the polyimide layer.

2. The production method for a flexible semiconductor substrate of claim 1, wherein step (b) comprises (b1) a step of applying a solution containing polyamic acid on the inorganic substrate, and a (b2) a step of imidizing the polyamic acid applied on the inorganic substrate.

3. The production method for a flexible semiconductor substrate of claim 1, wherein
   the inorganic substrate is an inorganic substrate which transmits light of a predetermined wavelength, the production method further comprising
   a step of, after step (c), irradiating the polyimide layer with light of the predetermined wavelength through the inorganic substrate.

4. The production method for a flexible semiconductor substrate of claim 1, wherein step (c) further comprises a step of forming an inorganic underlying layer on a surface for forming the semiconductor device, the semiconductor device being formed on the inorganic underlying layer.

5. The production method for a flexible semiconductor substrate of claim 1, further comprising a step of, after step (e1) and step (d) or before step (e2), forming a further polyparaxylene resin layer.

* * * * *